United States Patent [19]

Kato et al.

[11] Patent Number: 4,912,328
[45] Date of Patent: Mar. 27, 1990

[54] APPARATUS FOR IMPROVING THE SIGNAL-TO-NOISE RATIO OF IMAGE SIGNALS IN A SCAN-TYPE IMAGING SYSTEM

[75] Inventors: Makoto Kato, Kawasaki; Tetsuo Yokoyama, Tokyo; Juntaro Arima; Toshihiro Furuya, both of Katsuta, all of Japan

[73] Assignee: Hitachi, Ltd., Tokyo, Japan

[21] Appl. No.: 241,341

[22] Filed: Sep. 7, 1988

[30] Foreign Application Priority Data

Sep. 21, 1987 [JP] Japan ................................ 62-234803

[51] Int. Cl.<sup>4</sup> ............................................ H01J 37/28
[52] U.S. Cl. .................................... 250/310; 250/306; 250/311; 356/376
[58] Field of Search ............... 250/310, 311, 306, 398, 250/492.22; 356/376

[56] References Cited

U.S. PATENT DOCUMENTS 4,039,829 8/1977 Kato et al. ......................... 250/310
4,567,364 1/1986 Kano et al. ......................... 250/310

FOREIGN PATENT DOCUMENTS 59-112217 6/1984 Japan.

Primary Examiner—Jack I. Berman
Attorney, Agent, or Firm—Fay, Sharpe, Beall, Fagan, Minnich & McKee

[57] ABSTRACT

An apparatus for improving the signal-to-noise ratio of a scan-type imaging system, in which an image portion which appears virtually periodically or regularly on contiguous scanning lines and a scanning line for which the improvement of signal-to-noise ratio is intended are specified using cursors, the positional differences on the image signal waveforms between the specified scanning line and scanning lines in the specified image portion are detected, and the image signal waveforms in the specified image portion are added by being shifted by the amount of detected positional differences, so that the signal-to-noise ratio of the image signal waveform of the specified scanning line is improved.

6 Claims, 5 Drawing Sheets

APPARATUS FOR IMPROVING THE SIGNAL-TO-NOISE RATIO OF IMAGE SIGNALS IN A SCAN-TYPE IMAGING SYSTEM

BACKGROUND OF THE INVENTION

This invention relates to an apparatus for improving the signal-to-noise ratio of image signals in a scan-type imaging system, and particularly to an apparatus for improving the signal-to-noise ratio with the intention of reducing noises on the signal waveform in the measurement of dimensions with a semiconductor surface pattern scanning electron microscope (SEM).

In the semiconductor manufacturing process, where fineness is ever upgrading, it is imperative to measure the dimensions of semiconductor surface patterns. However, lower acceleration voltages are used for observation for such reasons as reducing damage to the semiconductor caused by the electron beam and consequently much noises are included in the image signal. Therefore, in measuring the line width based on the scanning waveform, the signal-to-noise ratio of the signal must be improved as a preprocessing.

JP-A-59-112217, for example, describes the noise reduction techniques, which include the FFT (Fast Fourier Transform) method, the multiplication gradient method, the averaging method, and the multiple frame addition method. The FFT method reduces high-frequency components through the frequency analysis, and the multiplication gradient method and averaging method conduct the averaging process for adjacent pixels on the waveform of a scanning line to reduce noises in the image signal. The multiple frame addition method conducts more than one scanning for the same place so that noises are averaged out. It is generally known that addition of n frames improves the signal-to-noise ratio by $\sqrt{n}$ times, and this fact holds irrespective of the shape of object in observation.

Even though the FFT method, multiplication gradient method and averaging method suppress noises, the averaging of adjacent pixels results unfavorably in a faint scan image. The multiple frame addition method has a drawback of increased damage to the sample due to the iterative scan on the same place by the electron beam.

SUMMARY OF THE INVENTION

This invention is intended to overcome the above prior art deficiencies, and its prime object is to provide an apparatus for improving the signal-to-noise ratio of a scan-type imaging system by reducing noises in the image signal in which a virtually identical image pattern appears virtually periodically or regularly.

According to this invention, when an image signal produced by a scan-type imaging system has, at least partly, periodicity or regularity, such a portion is specified and the position in the corresponding sections of image signals on contiguous lines in the specified portion is detected so that the image signals on the different lines are added thereby to reduce noises in the image signal in the specified portion. In contrast to the conventional method of improving signal-to-noise ratio in which the signal of the same position is sampled a number of times for adding multiple frames, the present invention features the single signal sampling on the basis of the overlaying of similar patterns in different places.

DESCRIPTION OF THE PREFERRED EMBODIMENT

Figure 1:
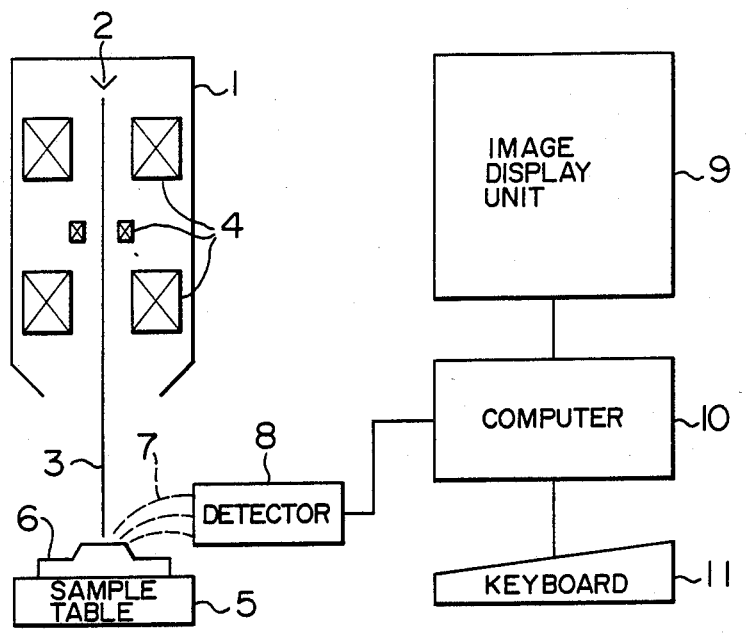
FIG. 1 is a block diagram showing the overall arrangement of an embodiment of this invention.

An embodiment of this invention will be described with reference to FIGS. 1 through 6. FIG. 1 shows the hardware arrangement of the dimension measuring system based on this invention. An electron beam 3 released by an electron gun 2 in an SEM main frame 1 is converged by an electron lens system 4 and incident to a sample 6 on a sample table 5. The electron beam 3 causes the sample 6 to release secondary electrons 7 from its surface, and they are detected by a detector 8. The detected signal is processed by a computer 10 in accordance with the instruction issued on a keyboard 11, and it is displayed on the image display unit 9.

Figure 3A:
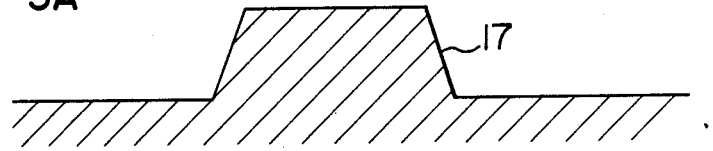
FIGS. 3A and 3B are a cross-sectional view of a sample and a waveform diagram showing the signal produced by scanning the sample.
Figure 3B:
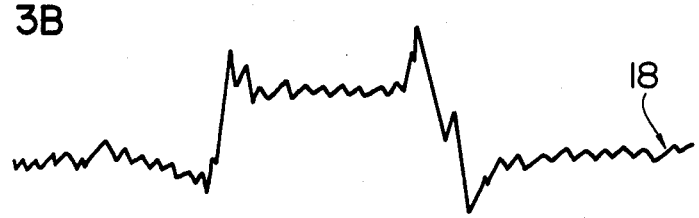
Figure 2:
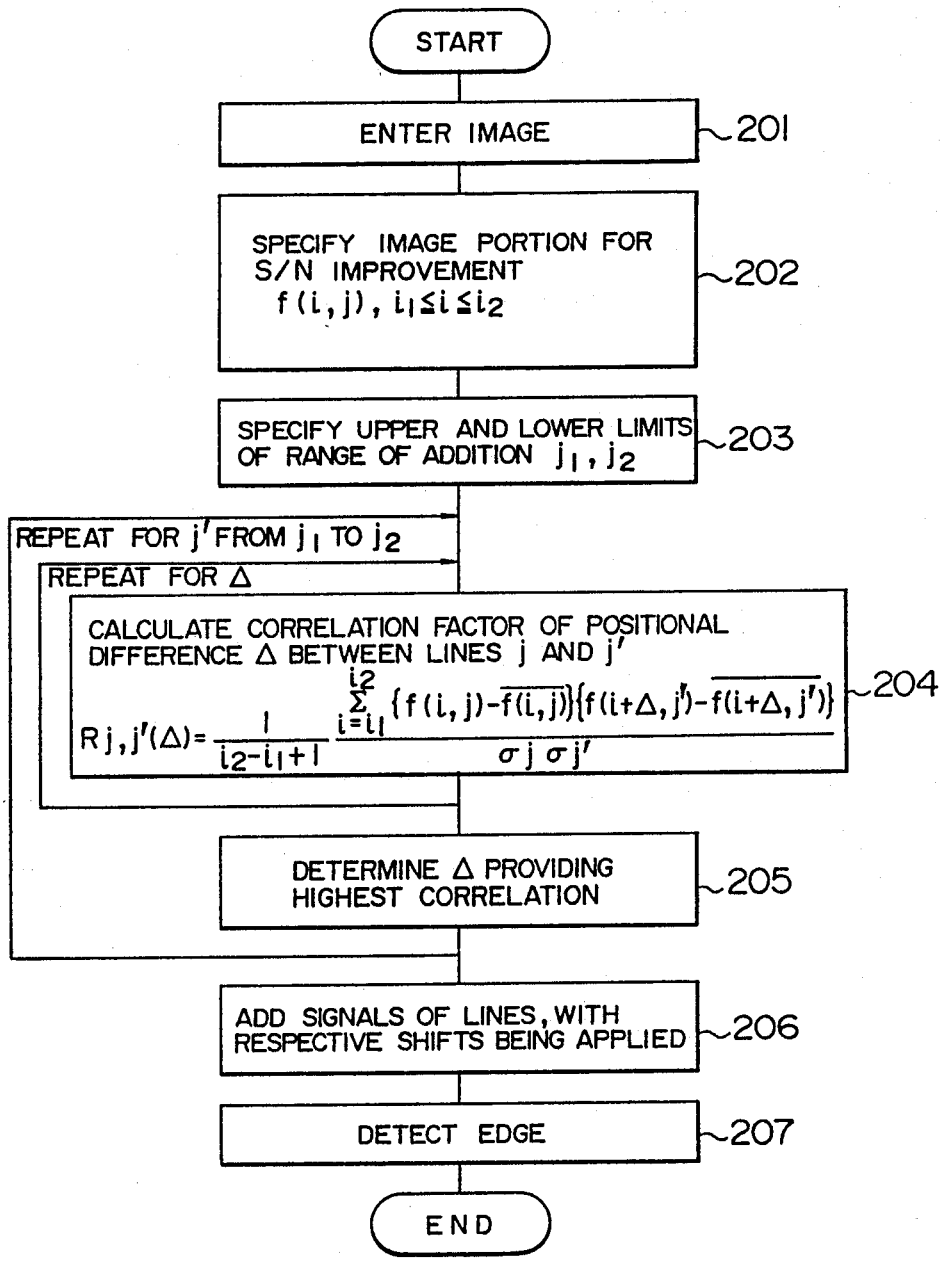
FIG. 2 is a flowchart used to explain the operation of the embodiment shown in FIG. 1.

FIG. 2 is a flowchart showing the sequence of the dimensions measuring process according to this embodiment. The content of each processing step will be explained using FIGS. 3 to 6. FIG. 3A shows a typical cross-section 17 of a semiconductor surface pattern, and FIG. 3B shows a typical scanning waveform 18 produced for the pattern cross-section.

Figure 4:
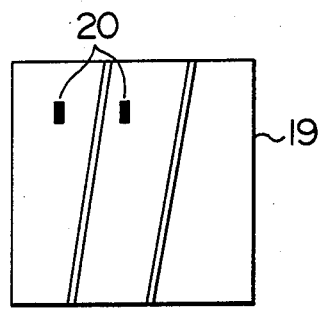
FIGS. 4 and 5 are diagrams showing images of the sample shown in FIG. 3, and explaining the methods of specifying the range of image for the s/n improvement.

Step 201 forms an image 19 of the semiconductor surface pattern as shown in FIG. 4 through the scanning operations equal in number to the scanning lines. In step 202, a pair of cursors 20 are placed on a scanning line of the image 19 as shown in FIG. 4, so that a slant edge portion on the waveform, where s/n improvement is intended is located between the cursors is specified. The cursors are designed to move together in the vertical direction and move independently in the horizontal direction through the key operations on the keyboard 11. Each pixel of displayed image has a signal intensity expressed by f(i,j), where i is the pixel position on a line and j is the line number. The pair of cursors 20 specify a line and an image signal portion from $i_1$ to $i_2$th pixels on the line where s/n improvement is intended. The specified range $i_1 \leq i \leq i_2$ is stored in the memory of the computer 10 through the key operation on the keyboard 11.

In step 203, the cursors 20 are moved vertically through the key operation on the keyboard 11 so that a lower-limit line $j_1$ and upper-limit line $j_2$ are specified. Image signals included in the range of $j_1 \leq j \leq j_2$ are thus specified for addition. The scanning lines $j_1$ and $j_2$ correspond to the scanning lines 22 and 21 in FIG. 5.

Figure 5:
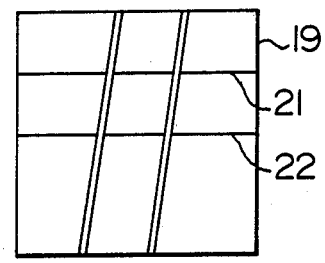
Figure 6A:
FIGS. 6A and 6B are diagrams explaining the correspondence between the scanning lines shown in FIG. 5 and the scanning waveforms.
Figure 6B:

The image 19 of FIG. 5 has edge lines located askew, and consequently the waveform 23 and 24 of FIGS. 6A and 6B for the scanning lines 21 and 22, respectively, are shifted from each other. Step 204 calculates the positional difference among scanning waveforms. Specifically, the cursors 20 are placed on a scanning line with the intention of noise reduction between scanning lines 21 and 22 as shown in FIG. 4 so as to extract a portion between the cursors as a template for noise reduction, and the correlations between the template and the scanning waveforms of scanning lines from 21 through 22 are calculated. The calculation is based on the following formula, with the scanning waveforms being shifted by one pixel at a time.

$$R_{jj'}(\Delta) = \frac{1}{i_2 - i_1 + 1} \cdot \frac{\sum_{i=i_1}^{i_2} \{f(i,j) - \overline{f(i,j)}\}\{f(i+\Delta,j') - \overline{f(i+\Delta,j')}\}}{\delta_j \delta_{j'}}$$

where $\Delta$ is the number of shifted pixels on the scanning waveform, $\overline{f(i,j)}$ is a mean value of the whole template, $j'$ is the scanning line number under correlation calculation against the template, $\overline{f(i+\Delta, j')}$ is a mean value with the $j$'th scanning line being shifted by $\Delta$, and $\delta_j$ and $\delta_{j'}$ are values for normalizing the above formula.

Step 204 calculates the above correlation formula at each shift by varying the shift value $\Delta$ by one pixel at a time in the range of $\pm(i_2-i_1)$.

As will be appreciated from the above formula, the higher the resemblance of scanning lines is, the greater is the correlation value $R_{jj'}(\Delta)$. Step 205 selects the largest of the correlation values obtained in step 204 at each shift position on a scanning line. Accordingly, the selected shift value provides the highest correlation, and the shift value represents the positional difference of the waveforms.

Figure 7A:
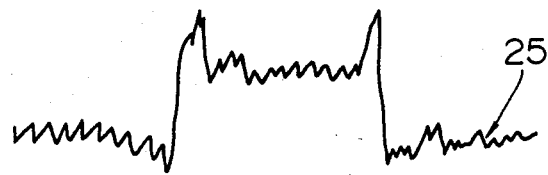
FIGS. 7A through 7D are diagrams showing scanning waveforms and the result of their addition.
Figure 7B:
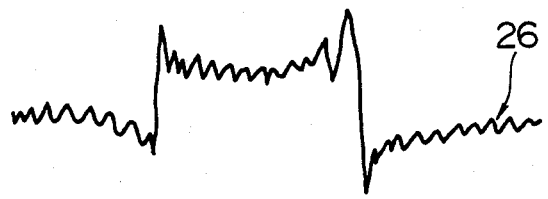
Figure 7C:
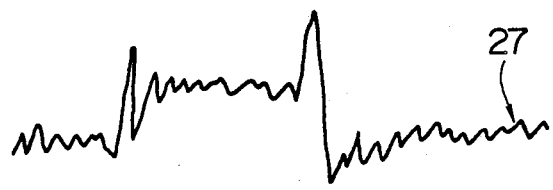
Figure 7D:
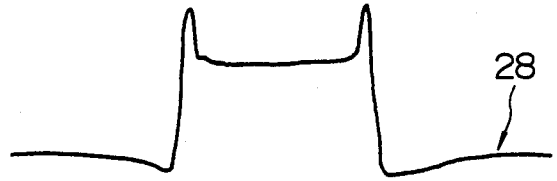

Steps 204 and 205 are carried out repeatedly for scanning lines $j_1$ through $j_2$ sequentially, and the positional difference with the highest correlation is calculated for each of these lines. In step 206, the scanning waveforms on the scanning lines $j_1$ through $j_2$ are added pixel-wise by being shifted by the positional differences obtained in step 205. As shown in FIGS. 7A, 7B and 7C, the positional differences among the scanning waveforms 25, 26 and 27 are made clear, and by adding the waveforms for averaging, with the respective shifts being applied thereto, a waveform 28 of reduced noise is obtained as shown in FIG. 7D.

Figure 8:
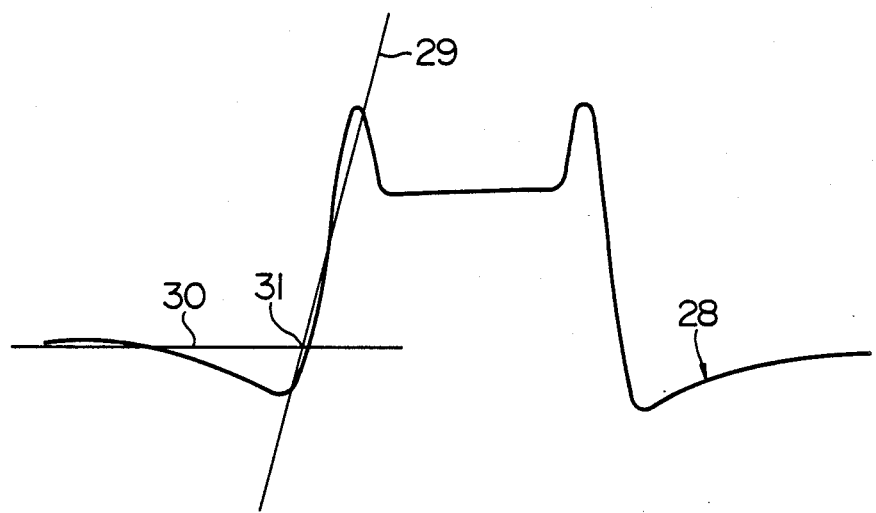
FIG. 8 is a diagram showing an example of the method of detecting the edge position on the scanning waveform.

Using the scanning waveform of reduced noise, which is the object of this invention, the line width of semiconductor surface pattern is measured in this embodiment. The measuring process includes the detection of the edge position on the semiconductor cross-section 17 of FIG. 3A from the waveform 28. Among various edge position detecting methods, Japanese Pat. Unexamined Publication No. 59-112217 discloses an example, in which the slant section and bottom section of the waveform 28 are approximated with straight lines 29 and 30 and their intersecting point 31 is determined to be a measurement base position, as shown in FIG. 8. The same process is conducted for another edge, and the distance between the two base positions is calculated as the line width of the semiconductor surface pattern.

According to this invention, noises included in the SEM image signal can be reduced without dealing with multiple frames.

We claim:

1. An apparatus for improving a signal-to-noise ratio of a scan-type imaging system comprising:
    specifying means for specifying an image portion which appears virtually periodically or regularly on a plurality of contiguous scanning lines;
    detecting means for detecting positional differences of image signal waveforms among the scanning lines in the image portion specified by said specifying means;
    means for adding, after correction, the positional differences of the image signal waveforms detected by said detecting means comprising means for detecting positional differences by amounts of shifts between a latter signal waveform associated with a remaining scanning line located in a range specified by said specifying means which is shifted to best coincide with a former signal waveform associated with a previously scanned line;
    wherein said detecting means comprises scanning line specifying means for specifying said remaining scanning lines sequentially, means of shifting, one pixel at a time, the image signal waveform of a scanning line specified by said scanning line specifying means, resemblance examining means for examining the resemblance of the image signal waveforms at each shift operation carried out by said shifting means, means of detecting a shift value providing a highest resemblance on the basis of the examination result provided by said resemblance examining means, and means of shifting the image signal waveforms of scanning lines in the specified range by the shift value detected by said shift value detecting means and adding the shifted waveforms pixel-wise.

2. An apparatus according to claim 1, wherein said shifting means comprises means of shifting pixels of n in number located in the range specified by said specifying means, sequentially from $+n$ to $-n$ one pixel at a time.

3. An apparatus according to claim 1, wherein said resemblance examining means comprises correlation examining means for examining the correlations between the former signal waveforms and the latter signal waveforms.

4. An apparatus according to claim 3, wherein said correlation examining means comprises means of calculating a correlation value between the former signal waveforms and the latter signal waveforms.

5. An apparatus according to claim 4, wherein said correlation calculating means comprises means of calculating a correlation value $R_{jj'}(\Delta)$ using the formula:

$$R_{jj'}(\Delta) = \frac{1}{i_2 - i_1 + 1} \cdot \frac{\sum_{i=i_1}^{i_2} \{f(i,j) - \overline{f(i,j)}\}\{f(i+\Delta,j') - \overline{f(i+\Delta,j')}\}}{\delta_j \delta_{j'}}$$

where $\Delta$ is the number of shifted pixels on the scanning waveform, $\overline{f(i,j)}$ is a mean value of a sampled template, $j'$ is a scanning line number for the correlation calculation against the template, and $\overline{f(i+\Delta,j')}$ is a mean value when the scanning line of line number $j'$ has been shifted by $\Delta$.

6. An apparatus according to claim 4, wherein said shift value detecting means comprises means of selecting a shift value which provides a largest correlation value among scanning lines.

* * * * *

UNITED STATES PATENT AND TRADEMARK OFFICE
CERTIFICATE OF CORRECTION

PATENT NO. : 4,912,328

DATED : March 27, 1990

INVENTOR(S) : Makoto Kato, et al.

It is certified that error appears in the above-identified patent and that said Letters Patent is hereby corrected as shown below:

Column 3, lines 16-19, the formula should read as follows:

$$\frac{\sum_{i=i_1}^{i_2} \{f(i,j) - \overline{f(i,j)}\}\{f(i+\Delta, j') - \overline{f(i+\Delta, j')}\}}{\delta_j \delta_{j'}}$$

Claim 5, column 4, line 55, the formula should read as follows:

$$\frac{\sum_{i=i_1}^{i_2} \{f(i,j) - \overline{f(i,j)}\}\{f(i+\Delta, j') - \overline{f(i+\Delta, j')}\}}{\delta_j \delta_{j'}}$$

Signed and Sealed this

Nineteenth Day of March, 1991

*Attest:*

HARRY F. MANBECK, JR.

*Attesting Officer*     *Commissioner of Patents and Trademarks*